United States Patent [19]
Masuyuki

[11] Patent Number: 5,638,179
[45] Date of Patent: Jun. 10, 1997

[54] METHOD FOR MEASURING AMOUNT OF BEND OF MOVING MIRROR

[75] Inventor: Takashi Masuyuki, Kanagawa-ken, Japan

[73] Assignee: Nikon Corporation, Tokyo, Japan

[21] Appl. No.: 603,342

[22] Filed: Feb. 20, 1996

[30] Foreign Application Priority Data

Feb. 20, 1995 [JP] Japan ................................. 7-030471

[51] Int. Cl.$^6$ ................................................. G01B 11/24
[52] U.S. Cl. .......................... 356/376; 356/377; 356/371; 356/394
[58] Field of Search ............................. 356/376, 377, 356/394, 371

[56] References Cited

U.S. PATENT DOCUMENTS

| | | | |
|---|---|---|---|
| 5,151,749 | 9/1992 | Tanimoto et al. | 356/375 |
| 5,151,750 | 9/1992 | Magome et al. | 356/401 |
| 5,473,435 | 12/1995 | Masuyuki et al. | |

FOREIGN PATENT DOCUMENTS

| | | |
|---|---|---|
| 6-29172 | 2/1994 | Japan . |
| 6-84753 | 3/1994 | Japan . |

*Primary Examiner*—Frank Gonzalez
*Assistant Examiner*—Reginald A. Ratliff
*Attorney, Agent, or Firm*—Armstrong, Westerman, Hattori, McLeland & Naughton

[57] ABSTRACT

Test reticle patterns (reticle pattern images) are transferred by exposure onto an unexposed wafer in a plurality of rows parallel to a predetermined direction, and a rotation angle of each reticle pattern image is obtained from an amount of positional displacement in the vertical direction (direction Y) (Steps 102 to 104). A rotation angle of each reticle pattern image is obtained from the bend of a moving mirror within an exposure range on a wafer stage which is obtained by correcting an amount of positional displacement in a horizontal direction (direction X) by the rotation angle obtained from the positional displacement in the vertical direction and the bend of the moving mirror assumed in a region outside the exposure range, and a residual rotation error between the thus obtained rotation angle and the actual rotation angle is obtained (Steps 105 to 107). An amount of bend of the moving mirror in the region outside the exposure range is obtained from the residual rotation error (Steps 108 and 109), thereby accurately measuring an amount of bend of the moving mirror in a region which is outside the exposure range and which is illuminated with a light beam from an interferometer for rotation error measurement.

14 Claims, 7 Drawing Sheets

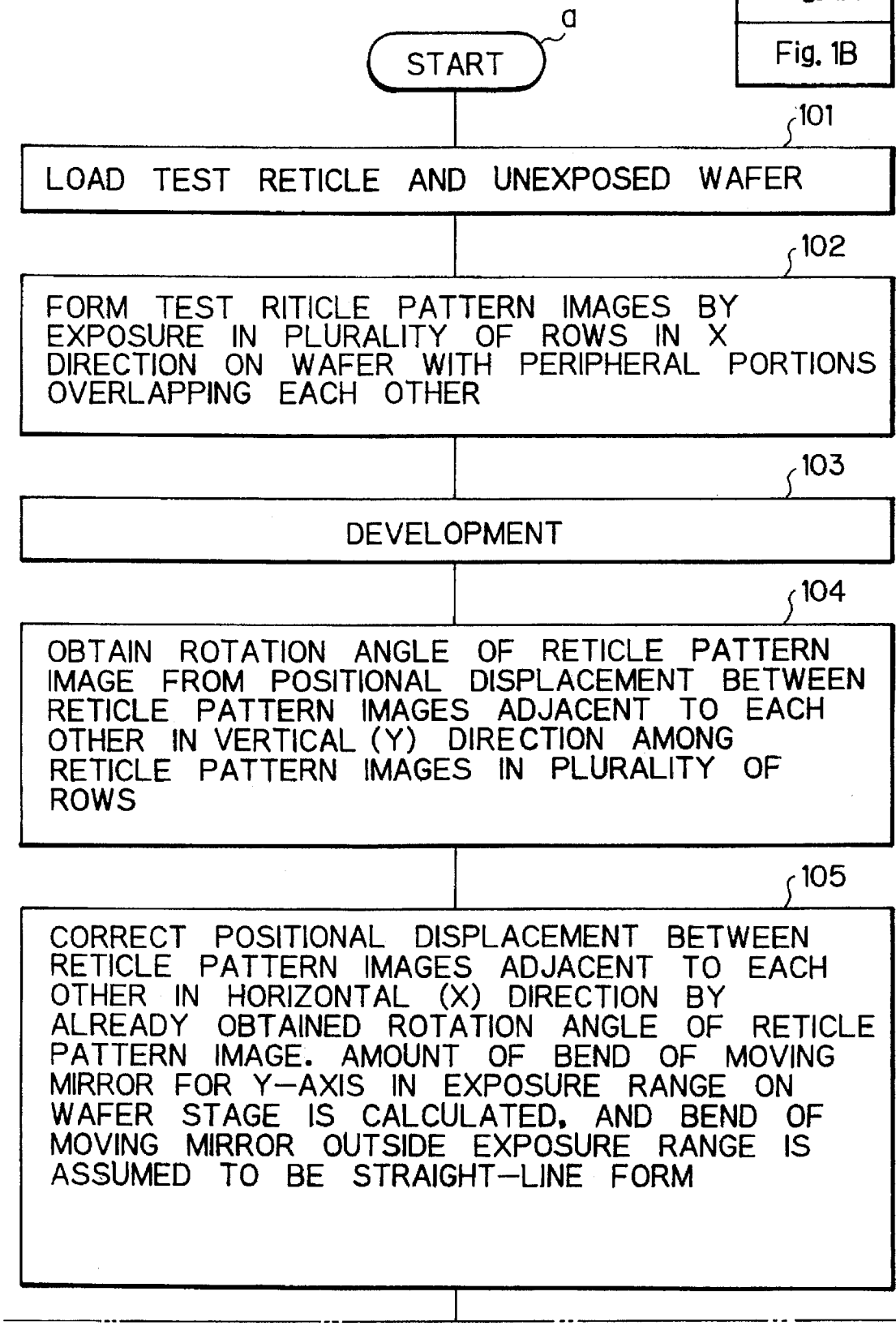

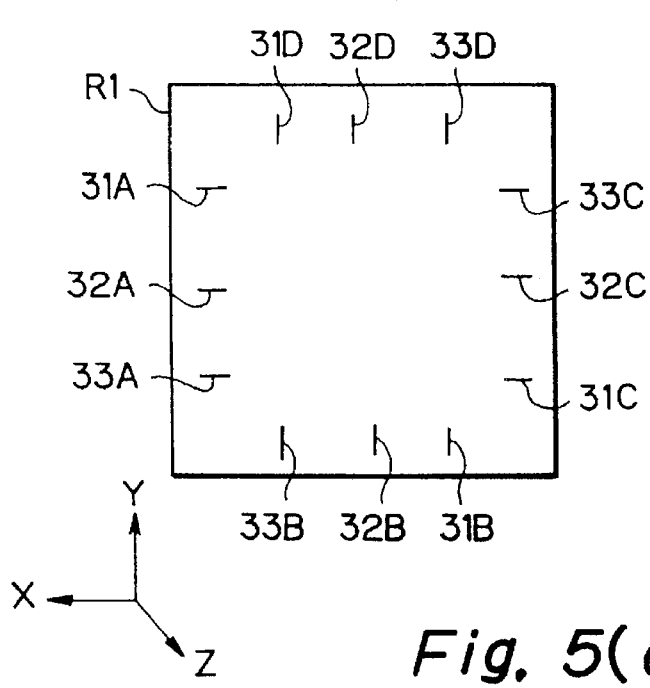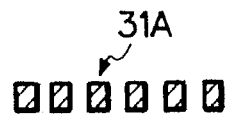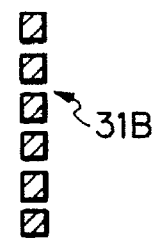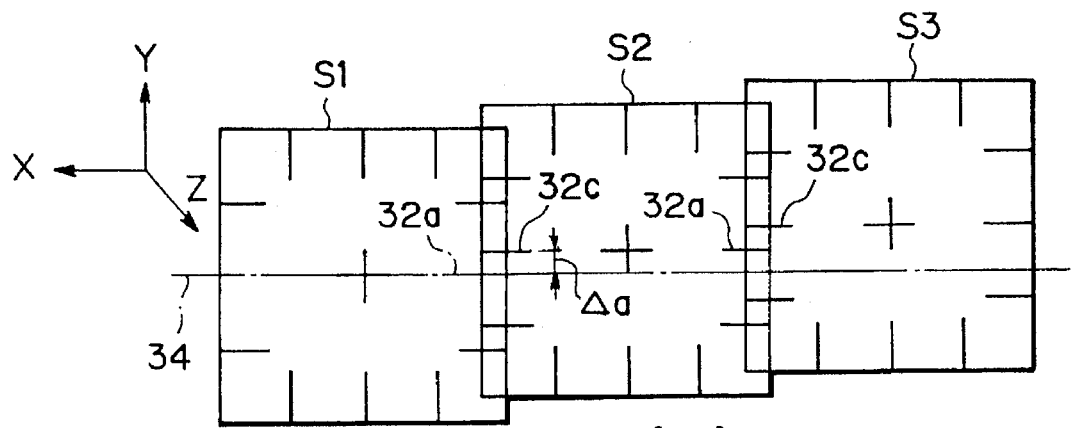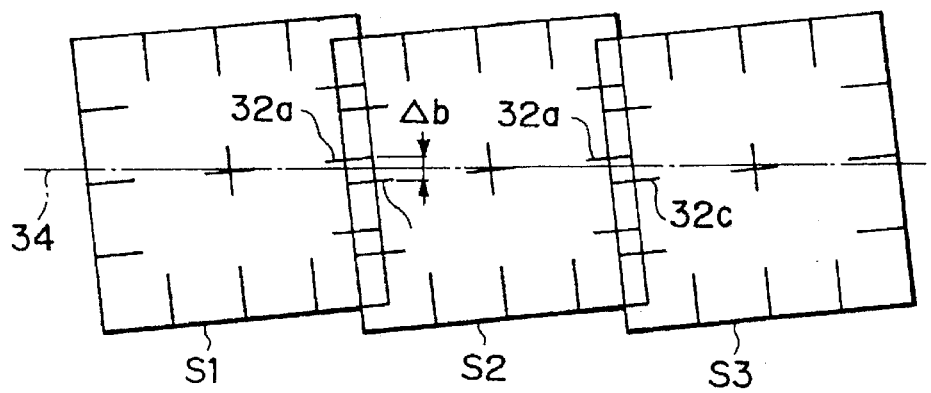

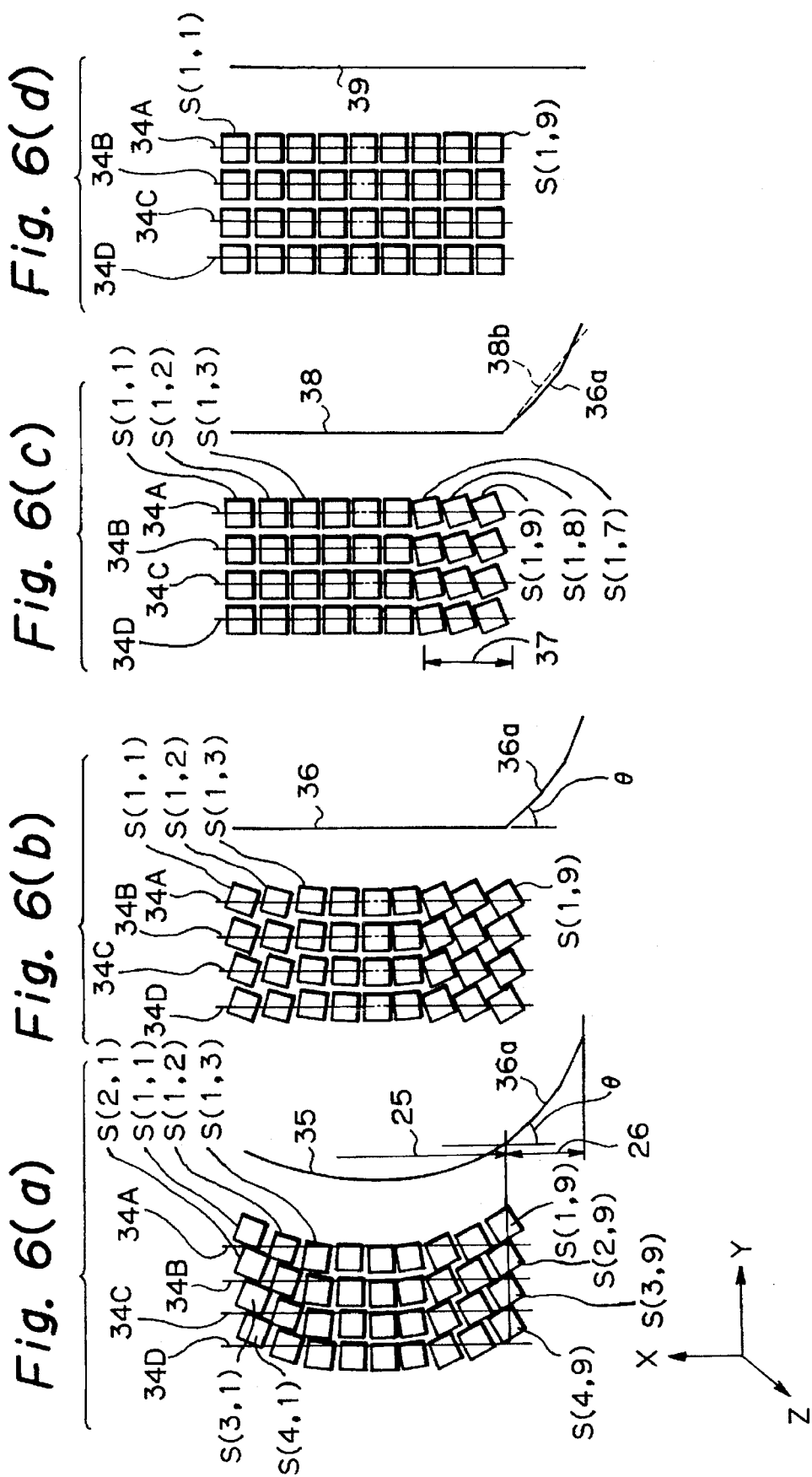

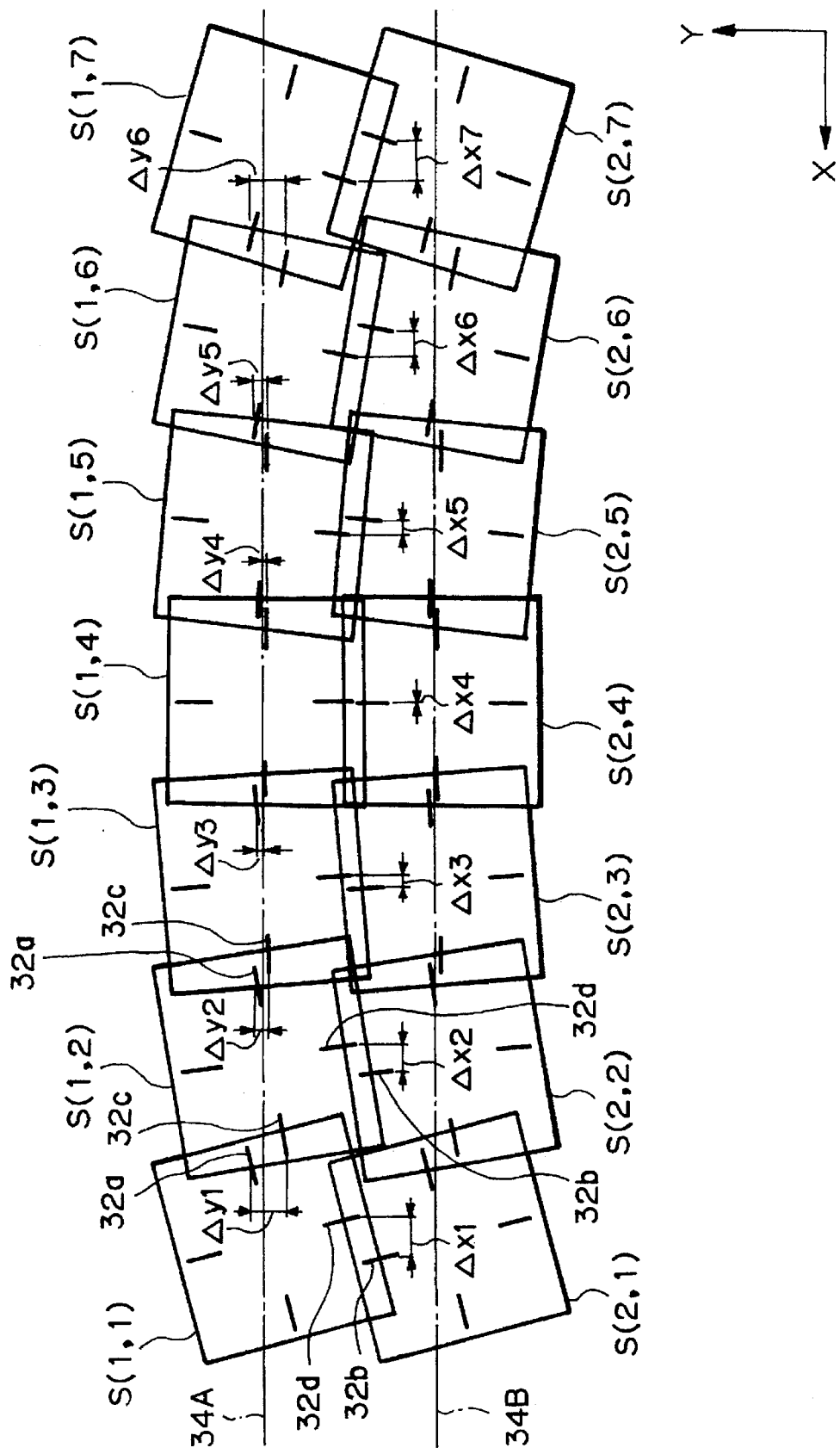

METHOD FOR MEASURING AMOUNT OF BEND OF MOVING MIRROR

BACKGROUND OF THE INVENTION

1. Field of the Invention

The present invention relates to a method for measuring an amount of bend of a moving mirror which is mounted on, for example, a wafer stage for carrying out coordinate measurement by a laser interferometric measuring method in an exposure system in which a reticle pattern is photolithographically transferred onto a wafer placed on the wafer stage. More particularly, the present invention relates to a moving mirror bend measuring method which is suitably applied to measure an amount of bend of a moving mirror in an exposure system of the type in which yawing of a wafer stage is corrected by rotating a reticle.

2. Related Background Art

To produce semiconductor devices, liquid crystal display devices, etc. by photolithography process, an exposure system is used in which a pattern formed on a reticle as a mask is photolithographically transferred onto each shot region on a wafer (or a glass plate or the like) coated with a photosensitive material. As an exposure system of this type, a reduction projection type exposure system (i.e. stepper) is frequently used in which a reticle pattern is sequentially transferred onto each shot region on a wafer placed on a wafer stage by stepwisely moving (stepping) the wafer stage according to the step-and-repeat method.

In such an exposure system, the coordinate position of the wafer stage in two directions (assumed to be directions X and Y) which perpendicularly intersect each other is generally measured by using two moving mirrors which are fixed on the wafer stage such that their reflecting surfaces perpendicularly intersect each other, and two laser interferometric measuring devices (hereinafter referred to as "interferometers") for two orthogonal axes which are disposed in association with the moving mirrors. In this case, it is desirable that the reflecting surfaces of the two moving mirrors should be perfect planes. In actual practice, however, the reflecting surfaces of the moving mirrors have unavoidable bend. It should be noted that unavoidable orthogonality deviation of the two moving mirrors is average bend of one moving mirror when the other moving mirror is defined as a reference. Therefore, orthogonality deviation is also treated as bend in the following description.

Accordingly, such control has heretofore been carried out that an amount of bend of each of the two moving mirrors (to be precise, an amount of bend of the reflecting surface thereof) has been measured in advance, coordinate values obtained by the interferometers are corrected by a software process on the basis of the result of the above measurement, thereby allowing the wafer stage to be accurately driven in two directions perpendicularly intersecting each other.

As a conventional method of measuring an amount of bend of a moving mirror, so-called vernier evaluation method is known. In the vernier evaluation method, a reticle formed with a plurality of measurement marks is used. First, a reticle pattern image is formed by exposure at a first position in the first row on the wafer. Then, the wafer stage is stepped in the direction X, for example, and a reticle pattern image is formed by exposure at a second position where an X-direction end of the image overlaps the first reticle pattern image. In the overlap region, a measurement mark image (main scale) formed by the first exposure and a measurement mark image (vernier) formed by the second exposure are disposed in close proximity to each other. The positional relationship between the main scale and the vernier in a state where the moving mirror has no bend has previously been known. Therefore, an amount of positional displacement between the main scale and the vernier relative to the design positional relationship is measured, thereby obtaining an amount of bend of the moving mirror. This is the principle of the vernier evaluation method.

Further, a conventional exposure system has an interferometer for measuring a yawing (rotation error) in the XY-plane of the wafer stage, which is installed separately from the pair of interferometers for coordinate measurement. The interferometer for rotation error measurement is installed in parallel to the interferometer for the Y-axis, for example, so as to apply a laser beam to the moving mirror for the Y-axis. Thus, a rotation angle of the wafer stage is measured from the difference between a value measured by the interferometer for the Y-axis and a value measured by the interferometer for rotation error measurement. In the exposure system having such an interferometer for rotation error measurement, the detected rotation angle is corrected for the amount of bend of the moving mirror for the Y-axis, which has previously been obtained, and then the reticle is rotated so that the remaining rotation angle component is canceled, thereby preventing rotation angle misalignment between each shot region on the wafer and the reticle.

However, the above-described conventional technique is incapable of measuring bend of a moving mirror at a portion thereof which is outside the exposure range on the wafer stage because an amount of bend of the moving mirror is measured from the result of the actual exposure. In the conventional practice, the interferometer for rotation error measurement is adapted to apply a laser beam to the moving mirror for the Y-axis, for example, at a position which is displaced in the direction X relative to the laser beam emitted from the Y-axis interferometer for coordinate measurement. Therefore, if the laser beam from the interferometer for the Y-axis is incident on an end region of the exposure range on the associated moving mirror, the laser beam from the interferometer for rotation error measurement is incident on a region outside the exposure range on the associated moving mirror. Consequently, the laser beam from the interferometer for rotation error measurement is incident on a region on the moving mirror for which an amount of bend has not accurately been measured. Accordingly, yawing of the wafer stage cannot accurately be corrected.

The reason for the above is that yawing of the wafer stage and the amount of bend of the moving mirror cannot accurately be separated from each other at a region outside the exposure range.

SUMMARY OF THE INVENTION

An object of the present invention is to provide a method for measuring an amount of bend of a moving mirror in an exposure system having an interferometer for rotation error measurement, whereby it is possible to accurately measure an amount of bend of the moving mirror in a region which lies outside the exposure range on the wafer stage and within a region which is illuminated by a light beam from the interferometer for rotation error measurement.

Another object of the present invention is to separate yawing of a wafer stage and an amount of bend of a moving mirror.

Still another object of the present invention is to estimate an amount of bend of a moving mirror at a region outside an exposure range on a wafer stage.

The present invention relates to a method for measuring an amount of bend of a first moving mirror (16Y) in an exposure system which has: a mask stage (RS) for correcting a rotation angle of a mask (R) formed with a pattern to be transferred; a substrate stage (13) for moving a photosensitive substrate, onto which the pattern of the mask (R) is to be transferred under application of illuminating light for exposure, in a first direction (direction Y) and a second direction (direction X), which intersect each other; a first moving mirror (16Y) fixed on the substrate stage and having a reflecting surface approximately perpendicular to the first direction (direction Y); a second moving mirror (16X) fixed on the substrate stage and having a reflecting surface approximately perpendicular to the second direction (direction X); a coordinate measuring device (17Y1, 17X) for applying a light beam for coordinate measurement to each of the first and second moving mirrors to measure coordinates of the substrate stage (13) in the first and second directions; and a rotation angle measuring device (17Y2) for applying a light beam for rotation angle measurement to the first moving mirror (16Y) to measure a rotation angle of the substrate stage (13). In the exposure system, the mask (R) is rotated through the mask stage (RS) so that the rotation angle measured by the rotation angle measuring device (17Y2) is canceled.

The method according to the present invention includes: the first step (step 102) where an evaluation mask (R1) formed with predetermined marks (32A to 32D) for evaluation is used as the mask (R), and a photosensitive substrate (W) for evaluation is placed on the substrate stage (13) and moved through the substrate stage (13), thereby transferring patterns (S(1,1), S(1,2), ... S(1,9)) of the evaluation mask (R1) onto a plurality of positions, respectively, which are arranged in the second direction (direction X) on the evaluation photosensitive substrate (W); the second step (step 104) where rotation angles of the evaluation mask patterns transferred onto the plurality of positions on the evaluation photosensitive substrate (W) when the evaluation photosensitive substrate (W) moves in the second direction (direction X) are calculated from the positions of the evaluation mask patterns on said evaluation photosensitive substrate; the third step (step 105) where an amount of bend of the first moving mirror (16Y) in a region (25) corresponding to an exposure range for forming the evaluation mask patterns on the evaluation photosensitive substrate (W) is calculated from the series of rotation angles calculated at the second step, and the bend of the first moving mirror (16Y) in a region (26) corresponding to a region outside the exposure range on the evaluation photosensitive substrate (W) is assumed to be a predetermined form from the series of rotation angles calculated at the second step; the fourth step (step 107) of obtaining residual rotation errors between rotation angles of the evaluation mask patterns which are determined according to the bend of the first moving mirror (16Y) obtained at the third step and the rotation angles of the evaluation mask patterns calculated at the second step; and the fifth step (steps 108 and 109) of obtaining a bend of the first moving mirror (16Y) in the region (26) corresponding to a region outside the exposure range on the evaluation photosensitive substrate (W) from the residual rotation errors obtained at the fourth step.

In this case, it is desirable that at the first step, patterns (S(1,1) to S(1,9) and S(2,1) to S(2,9)) of the evaluation mask (R1) should be transferred onto respective regions on the evaluation photosensitive substrate (W) which are arranged in two rows parallel to the second direction (direction X), and that at the second step, rotation angles of the evaluation mask patterns formed when the evaluation photosensitive substrate (W) moves in the second direction (direction X) should be calculated from an amount of positional displacement ($\Delta x$) between the rows of evaluation mask patterns.

In other words, the method according to the present invention is carried out as follows:

At the second step, for each of the evaluation mask patterns transferred in one row on the evaluation photosensitive substrate (W), a rotation angle is measured from the amount of positional displacement between two evaluation marks, for example, thereby obtaining a rotation angle of the evaluation mask (R1) at the exposure position of that pattern.

However, to obtain the rotation angle even more readily and accurately, evaluation mask patterns should be transferred onto two rows of regions on the evaluation photosensitive substrate arranged in the second direction (direction X), as shown for example in FIG. 6(a). In this case, the rotation angles of the patterns (S(1,1) and S(2,1)) transferred to the first positions in the two rows, for example, can be regarded as the same; therefore, the rotation angle of the evaluation mask pattern at the first position in each row can be accurately measured by measuring the amount of positional displacement ($\Delta x1$) between the lower side of the first-row pattern (S(1,1)) and the upper side of the second-row pattern (S(2,1)).

Next, at the third step, the amount of positional displacement according to the rotation angle of the evaluation mask patterns, obtained at the second step, is subtracted from the amount of positional displacement ($\Delta y1$) between a pair of adjacent evaluation mask patterns in one row of regions arranged in the second direction (direction X), for example, thereby obtaining an amount of bend of the first moving mirror (16Y) in a region within the exposure range (25). Then, the bend of the first moving mirror (16Y) in the extra-exposure range region (26) is assumed to be a straight-line form, for example. Thereafter, at the fourth step, rotation angles of the evaluation mask patterns at a series of positions arranged in the second direction (direction X) are estimated from the amount of bend of the first moving mirror (16Y) obtained at the third step. In this case, there are residual rotation errors between the estimated rotation angles and the rotation angles actually measured at the second step, which correspond to the difference in the amount of bend of the moving mirror (16Y) in the extra-exposure range region (26). Accordingly, the actual amount of bend of the moving mirror (16Y) in the extra-exposure range region (26) can be accurately estimated from the residual rotation errors.

BRIEF DESCRIPTION OF THE DRAWINGS

FIGS. 1A and 1B are flowcharts showing one embodiment of the moving mirror bend measuring method according to the present invention.

FIGS. 4(a), 4(b) and 4(c) show the pattern layout of a test reticle used in the embodiment and also illustrate the arrangement of evaluation marks.

FIGS. 5(a) and 5(b) illustrate the amount of positional displacement due to bend of a moving mirror and the amount of positional displacement due to rotation when reticle patterns are transferred in a single row by exposure.

FIGS. 6(a), 6(b), 6(c) and 6(d) illustrate an array of reticle pattern images formed by exposure on a wafer for evaluation when the moving mirror bend measuring method is carried out, together with an array obtained by correcting the reticle pattern image array.

FIG. 7 shows an essential part of one example of an array of reticle pattern images formed by exposure on a wafer for evaluation in the embodiment.

DESCRIPTION OF THE PREFERRED EMBODIMENTS

One embodiment of the moving mirror bend measuring method according to the present invention will be described below with reference to the accompanying drawings. In this embodiment, the present invention is applied to measure an amount of bend of a moving mirror in a stepper type projection exposure system having a function whereby a rotation error of a wafer stage when set in an exposure position is corrected by rotating a reticle stage.

Figure 2:
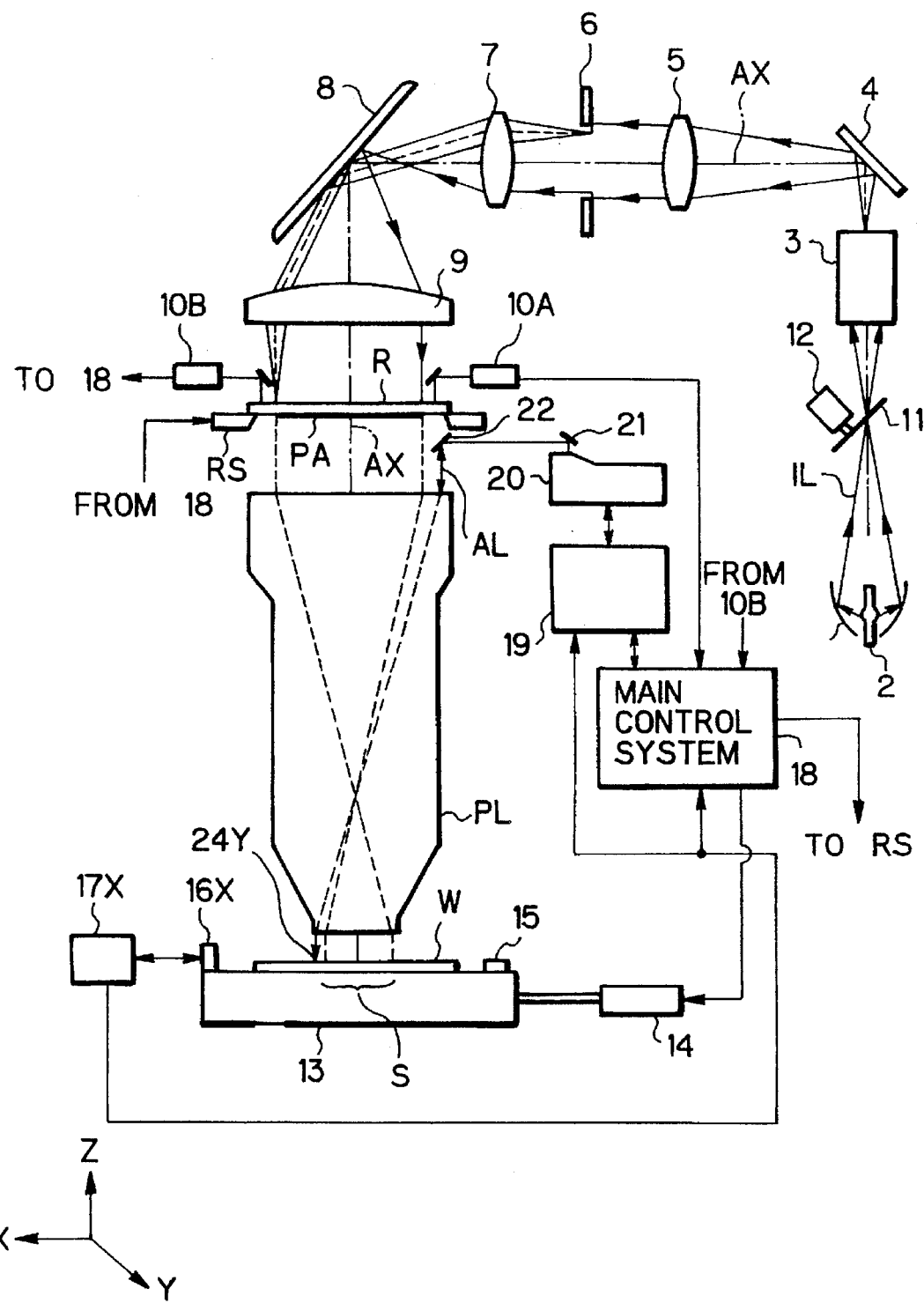
FIG. 2 shows the arrangement of a projection exposure system which is used in the embodiment of the present invention.

FIG. 2 schematically shows the arrangement of a projection exposure system used in this embodiment. Referring to FIG. 2, illuminating light IL emitted from a super-high pressure mercury-vapor lamp 1 is reflected by an elliptical mirror 2 and once converged on the secondary focal point of the elliptical mirror 2. Then, the illuminating light IL enters an illuminance distribution uniformizing system 3 which includes a collimator lens, an interference filter, an optical integrator (fly-eye lens), an aperture stop (σ stop), etc.

A shutter 11 is disposed in the vicinity of the secondary focal point of the elliptical mirror 2. The shutter 11 is driven by a motor 12 to open and close the optical path of the illuminating light IL. It should be noted that, as the illuminating light IL for exposure, it is possible to use laser light, e.g., excimer laser (KrF excimer laser, ArF excimer laser, etc.), or metal vapor laser or YAG laser harmonic, in addition to emission lines from the super-high pressure mercury-vapor lamp 1 or the like.

In FIG. 2, illuminating light (i-line, for example) IL of a wavelength to which the photoresist layer is sensitive is reflected by a mirror 4, and then passes through a first relay lens 5, a variable field stop (reticle blind) 6 and a second relay lens 7 to reach a mirror 8. The illuminating light IL is reflected approximately vertically downward to illuminate a pattern area PA of a reticle R through a main condenser lens 9 with an approximately uniform illuminance distribution. The reticle blind 6 is disposed in a plane which is in conjugate relation (image-formation relation) to the surface of the reticle R on which patterns are formed. Accordingly, the illumination field of the reticle R can be set as desired by changing the size and configuration of the opening of the reticle blind 6.

The illuminating light IL passing through the pattern area PA of the reticle R enters a projection optical system PL which is telecentric on both sides (or on one side). Then, a projected image of the pattern of the reticle R which is reduced to ⅕, for example, by the projection optical system PL is projected (formed) in one shot region on a wafer W which is coated at its surface with a photoresist layer, and which is held so that its surface is approximately coincident with the best focus plane of the projection optical system PL. Here, a Z-axis is taken in a direction parallel to an optical axis AX of the projection optical system PL, and an X-axis is taken in a direction parallel to the plane of FIG. 2 in a plane perpendicular to the Z-axis. Further, a Y-axis is taken in a direction perpendicular to the plane of FIG. 2.

In this embodiment, the reticle R is placed on a reticle stage RS which is two-dimensionally movable in a horizontal plane perpendicular to the optical axis AX of the projection optical system PL and also rotatable, and the positioning operation of the reticle stage RS is controlled by a main control system 18 which controls the whole system. Further, both end portions of the pattern surface (lower surface) of the reticle R is formed with cross-shaped alignment marks used as references for alignment of the reticle R (i.e. alignment of the reticle R with respect to the optical axis AX of the projection optical system PL). A pair of reticle alignment systems (hereinafter referred to as "RA systems") 10A and 10B are disposed above the reticle R at respective positions corresponding to the alignment marks. The RA systems 10A and 10B are adapted to detect the positions of the two alignment marks on the reticle R. In the initial state, the main control system 18 slightly moves the reticle stage RS on the basis of measured signals sent from the RA systems 10A and 10B, thereby positioning the reticle R so that the center point of the pattern area PA coincides with the optical axis AX of the projection optical system PL.

Meanwhile, the wafer W is held by vacuum on a wafer holder (not shown) which is slightly rotatably mounted on a wafer stage 13. The wafer stage 13 is arranged so as to be two-dimensionally movable in a step-and-repeat manner by a driver 14. Upon completion of transfer exposure of the reticle R with respect to one shot region on the wafer W, the wafer stage 13 is stepped to the subsequent shot position.

Figure 3A:
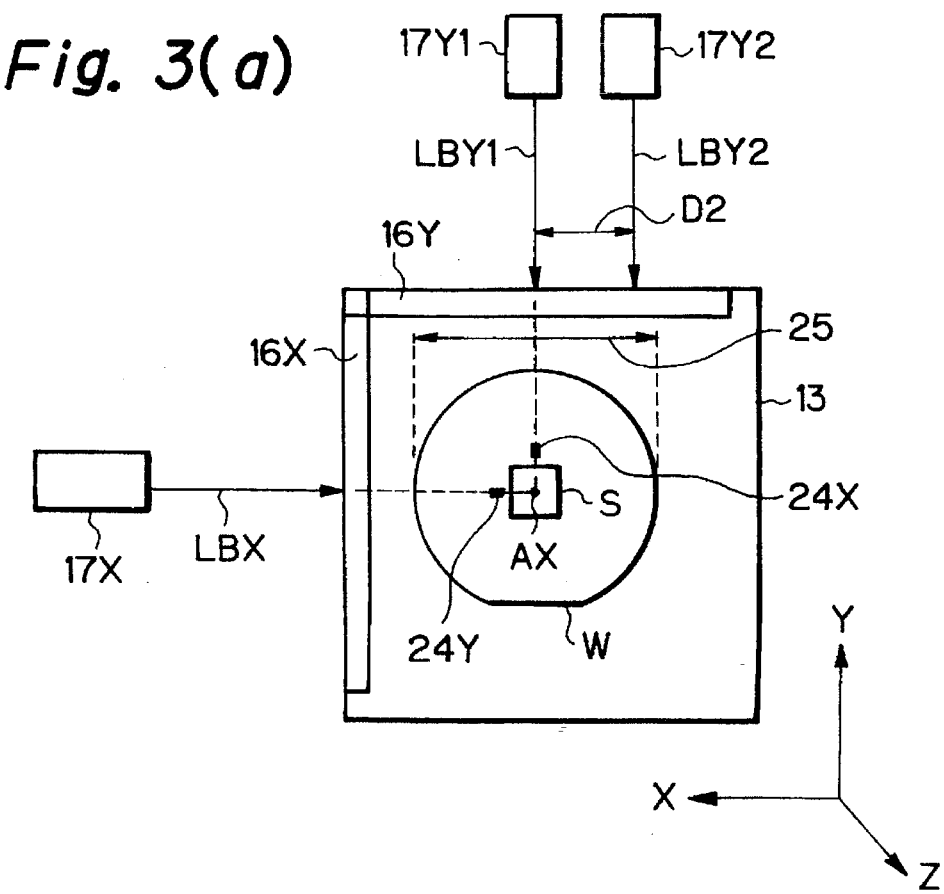
FIG. 3(a) is a plan view showing a mechanism for measuring the coordinates of a wafer stage in the projection exposure system shown in FIG. 2.

FIG. 3(a) shows a coordinate measuring mechanism for the wafer stage 13 shown in FIG. 2. Referring to FIG. 3(a), a moving mirror 16X for the X-axis and a moving mirror 16Y for the Y-axis are fixed on the wafer stage 13 so that their reflecting surfaces are approximately perpendicular to each other. In this case, the reflecting surfaces of the moving mirrors 16X and 16Y are set so as to be approximately perpendicular to the plane of FIG. 2. An interferometer (laser interferometric measuring device) 17X for the X-axis is fixed so as to face the moving mirror 16X. Further, an interferometer 17Y1 for the Y-axis and an interferometer 17Y2 for rotation error measurement are fixed so as to face the moving mirror 16Y. A laser beam LBX from the interferometer 17X is incident approximately perpendicularly on the reflecting surface of the moving mirror 16X. Similarly, laser beams LBY1 and LBY2 from the interferometers 17Y1 and 17Y2 are incident approximately perpendicularly on the reflecting surface of the moving mirror 16Y.

In this embodiment, the optical axis of the laser beam LBX from the interferometer 17X and the optical axis of the laser beam LBY1 from the interferometer 17Y1 are set so as to cross the optical axis AX of the projection optical system PL. The optical axis of the laser beam LBY2 from the interferometer 17Y2 is set so as to cross the optical axis of an off-axis alignment system (not shown) which is disposed on the −X direction side of the projection optical system PL. The interferometers 17X, 17Y1 and 17Y2 constantly detect coordinate values, respectively, at a resolution of the order of 0.01 μm, for example, and supply the detected coordinate values to the main control system 18 and also to an alignment control system 19, which are shown in FIG. 2.

The coordinate that is measured by the interferometer 17X is determined to be the X coordinate of the wafer stage 13, and the coordinate that is measured by the interferometer 17Y1 is determined to be the Y coordinate of the wafer stage 13. It should be noted that an average value of coordinates that are measured by the two interferometers 17Y1 and 17Y2, for example, may be determined to be the Y coordinate of the wafer stage 13. The X and Y coordinates of the wafer stage 13, which are determined from the results of the interferometric measurement in this way, are defined as coordinates (X,Y) in a stage coordinate system (or a stationary coordinate system). Further, the main control system 18, shown in FIG. 2, calculates an error of rotation about the Z-axis based on yawing or the like of the wafer stage 13 from a difference between coordinates measured by the two interferometers 17Y1 and 17Y2, and causes the reticle R to rotate through the reticle stage RS in accordance with the calculated rotation error.

Thus, in this embodiment, a rotation error of the wafer stage 13 is obtained from a difference (relative error) between values measured by the two interferometers 17Y1 and 17Y2. Accordingly, if it is assumed that the moving mirror 16Y for the Y-axis has no bend, an amount of rotation of the wafer stage 13 can be accurately detected from a difference between values measured by the two interferometers 17Y1 and 17Y2. In actuality, however, the moving mirror 16Y (to be precise, the reflecting surface thereof) is slightly bent in the direction X. Therefore, when the wafer stage 13 moves in the direction X, a change of bend of the moving mirror 16Y corresponding to the position in the direction X appears as a difference between values measured by the two interferometers 17Y1 and 17Y2, together with yawing of the wafer stage 13. Accordingly, in order to correct a rotation error based only on yawing of the wafer stage 13, it is necessary to subtract an amount of change based on the bend of the moving mirror 16Y, which is obtained as described later, from a difference between values measured by the two interferometers 17Y1 and 17Y2 and to calculate a true rotation angle of the wafer stage 13 on the basis of the remaining difference. By doing so, it is possible to correct a rotation angle of the wafer stage 13 (and hence a rotation angle of the reticle R) attributable to the bend of the moving mirror 16Y, that is, a pseudo rotation error of the wafer stage 13.

As shown in FIG. 2, the wafer stage 13 is further provided thereon with a reference member (glass substrate) 15 having reference marks which are used to measure a base line quantity (i.e. an amount of displacement between a reference position of the alignment system and an exposure reference position). The reference member 15 is installed so that its surface is approximately flush with the surface of the wafer W which is to be exposed.

In this embodiment, in order to measure an amount of bend of a moving mirror by using the vernier evaluation method, images of predetermined evaluation marks of a test reticle R1 (see FIG. 4(a)) are formed in a predetermined arrangement on an unexposed wafer W by exposure, and after development process, the positions of the evaluation mark images are measured. The pattern layout of the test reticle R1 will be explained below, together with an alignment system for detecting the positions of the evaluation mark images.

FIG. 4(a) shows the test reticle R1 used in this embodiment in a state where it has been placed and positioned on the reticle stage RS, shown in FIG. 2. Referring to FIG. 4(a), the test reticle R1 has identical evaluation marks 31A, 32A and 33A which are formed on the +X direction end portion in a pattern area thereof at equal intervals in the direction Y. Further, three groups of three evaluation marks (33B, 32B and 31B), (31C, 32C and 33C) and (33D, 32D and 31D) are formed at respective positions corresponding to the evaluation marks 31A, 32A and 33A as rotated counterclockwise through 90°, 180° and 270° about the center of the pattern area. Accordingly, the evaluation marks 31A to 33A and the evaluation marks 31C to 33C are formed at respective positions which are approximately in point symmetry about the center of the test reticle R1, and so are the evaluation marks 31B to 33B and the evaluation marks 31D to 33D.

For example, the evaluation mark 31A is, as shown in FIG. 4(b), a string of dot patterns which are arrayed in the direction X at a predetermined pitch. Accordingly, the evaluation mark 31B, which is equivalent to the evaluation mark 31A as rotated through 90°, is a string of dot patterns, as shown in FIG. 4(c), which are arrayed in the direction Y at a predetermined pitch. The evaluation mark 31A may be formed as opening patterns in a light-blocking film. Alternatively, the evaluation mark 31A may be formed from a light-blocking film which is disposed in a transparent portion of the test reticle R1. Images of the evaluation marks 31A, 31B, . . . are formed on a photoresist-coated wafer W by exposure, and then development is carried out to obtain resist patterns (evaluation mark images) as strings of dot patterns in the form of dimple patterns. The positions of the evaluation mark images are detected by an alignment system based on the laser step alignment method, which will be described below. Further, the test reticle R1 has two cross-shaped alignment marks (not shown) which are formed on the outer peripheral portions thereof so as to face opposite each other.

Referring to FIG. 2, an alignment system 20 for the Y-axis, which is based on both the TTL (Through-The-Lens) method and the laser step alignment (hereinafter referred to as "LSA type alignment system"), is disposed on a side of the top of the projection optical system PL. A laser beam AL for position detection is emitted from the alignment system 20 and led to the projection optical system PL via mirrors 21 and 22. The projection optical system PL applies the laser beam AL to a position in the vicinity of a reticle pattern projection area (exposure shot) S on the wafer W, as shown in FIGS. 2 and 3(a), in the form of slit-shaped spot of light 24Y which is elongate in the direction X. Referring to FIG. 2, the wafer stage 13 is driven to move the above-described evaluation mark image (e.g. a dimple pattern formed from the evaluation mark 31A, as shown in FIG. 4(b)) so that the evaluation mark image scans across the light spot 24Y. Then, when the evaluation mark image crosses the light spot 24Y, diffracted light from the evaluation mark image is returned to the alignment system 20 through the projection optical system PL and via the mirrors 22 and 21. The light is photoelectrically converted in the alignment system 20, and the resulting detection signal is supplied to the alignment control system 19. A more specific arrangement of the LSA type alignment system is disclosed, for example, in U.S. Pat. No. 5,151,750 (corresponding to Japanese Patent Application Unexamined Publication (KOKAI) No. 2-272305).

The alignment control system 19 is also supplied with the coordinates (X,Y) of the wafer stage 13 which are measured by the interferometers 17X, 17Y1 and 17Y2. Accordingly, the alignment control system 19 detects the Y coordinate of the wafer stage 13, for example, when the detection signal supplied from the alignment system 20 reaches a peak as being the Y coordinate of an evaluation mark image as an object to be measured, and supplies the detected Y coordinates of the evaluation mark images to the main control system 18 one after another.

As shown in FIG. 3(a), an LSA type alignment system for the X-axis is also disposed to apply a laser beam in the vicinity of the +Y direction end of the reticle pattern projection area S on the wafer W so that the laser beam forms a slit-shaped spot of light 24X which is elongate in the direction Y. In this case, an evaluation mark image is moved to scan across the light spot 24X in the direction X, and diffracted light from the evaluation mark image is received by an alignment system for the X-axis. The detection signal from the alignment system for the X-axis is also supplied to the alignment control system 19, shown in FIG. 2. The alignment control system 19 obtains the X coordinate of the evaluation mark image from the detection signal, and supplies it to the main control system 18.

As will be understood from FIG. 3(a), in the LSA type alignment system, the positions of the light spots 24Y and 24X are off the optical axis AX of the projection optical system PL toward the non-measuring direction. Accordingly, if there is rotation of the wafer stage 13, a so-called Abbe error gets mixed in the values measured by the two alignment systems. Therefore, in this embodiment, the Abbe error is corrected by using a rotation error of the wafer stage 13 which is obtained from a difference between the coordinates measured by the two interferometers 17Y1 and 17Y2, and the distance from the optical axis AX to each of the light spots 24Y and 24X, which has previously been obtained.

In FIG. 2, the main control system 18 corrects the coordinates of each evaluation mark image supplied from the alignment control system 19 for the Abbe error, and arithmetically processes the corrected coordinates, as described later, to measure an amount of bend of the moving mirror 16Y for the Y-axis. It should, however, be noted that the coordinates of each evaluation mark image may be arithmetically processed in another processing unit.

In this embodiment, the pattern of the test reticle R1, shown in FIG. 4(a), is sequentially transferred and formed in a predetermined arrangement on the wafer W by exposure and development processes, and a positional displacement between the resulting evaluation mark images is detected to measure an amount of bend of the moving mirror 16Y. The following is an explanation of some problems associated with the bend measuring process.

First, let us discuss a case where, as shown in FIGS. 5(a) and 5(b), the pattern of the test reticle R1, shown in FIG. 4(a), is sequentially transferred by exposure onto the wafer W at a predetermined pitch in the direction X along a straight line 34 which is parallel to the X-axis so that the right and left evaluation mark images of each pair of adjacent reticle pattern images overlap each other. In this case, positioning of the wafer stage 13, shown in FIG. 3(a), is carried out so that the Y coordinate measured by the interferometer 17Y1 for the Y-axis is constant, whereas the X coordinate measured by the interferometer 17X for the X-axis changes at a predetermined pitch. Further, the test reticle R1 is rotated through the reticle stage RS through an angle corresponding to a difference between values measured by the two interferometers 17Y1 and 17Y2.

Let us assume that the moving mirror 16Y is straight and slightly inclined with respect to the X-axis, and that, in the initial state, a difference between values measured by the two interferometers 17Y1 and 17Y2 is stored as an offset, and thereafter, the rotation angle of the test reticle R1 is corrected on the basis of the result of subtracting the offset from a difference between values measured by the two interferometers 17Y1 and 17Y2. Consequently, as shown in FIG. 5(a), reticle pattern images S1, S2, S3, . . . are formed such that the centers of these images gradually shift in the direction Y with respect to the straight line 34. Each of the reticle pattern images S1, S2, S3, . . . has inverted images of the evaluation marks 31A to 33D, shown in FIG. 4(a). In the following, patterns obtained after the images of the evaluation marks 31A to 33D have been developed are represented by evaluation mark images 31a to 33d.

In the case of FIG. 5(a), the centers of the reticle pattern images S1, S2, S3, . . . gradually shift in the direction Y in conformity to the bend of the moving mirror 16Y. Because the test reticle R1 is not rotated from the position in the initial state, the evaluation mark image 32c at the left end of the second reticle pattern image S2, for example, is displaced relative to the evaluation mark image 32a at the right end of the first reticle pattern image S1 by a distance $\Delta a$ in the direction Y. Accordingly, by measuring the distance $\Delta a$ with the above-described LSA type alignment system, an inclination angle (this is also a kind of bend) of the moving mirror 16Y with respect to the X-axis is detected.

Let us now assume that the moving mirror 16Y is parallel to the X-axis and straight, and that, because of a difference between values measured by the two interferometers 17Y1 and 17Y2 in the initial state, the test reticle R1 was rotated through an angle corresponding to the difference. In this case, as shown in FIG. 5(b), reticle pattern images S1, S2, S3, . . . are formed in a state where each reticle pattern image is rotated through the same angle as the rotation angle in the initial state, although the centers of the reticle pattern images S1, S2, S3, . . . do not shift from the straight line 34. Accordingly, the evaluation mark image 32a at the right end of the first reticle pattern image S1, for example, is displaced relative to the evaluation mark image 32c at the left end of the second reticle pattern image S2 by a distance $\Delta b$ in the direction Y. Therefore, it is likely that the amount of displacement will be erroneously recognized as an amount of bend of the moving mirror 16Y. For this reason, it is necessary in order to accurately obtain only an amount of bend of the moving mirror 16Y to accurately separate the amount of positional displacement between the evaluation mark images of a pair of adjacent reticle pattern images into a component derived from the bend of the moving mirror 16Y and a component caused by the rotation (pseudo rotation error) of the reticle due to the bend of the moving mirror 16Y (or the offset of the difference between the values measured by the two interferometers 17Y1 and 17Y2).

In a case where an amount of bend of a moving mirror is measured by exposure as in this embodiment, an area in which an amount of bend of the moving mirror 16Y can be accurately measured by the conventional method is restricted within an exposure range 25 having a width approximately equal to the diameter of the wafer W on the wafer stage 13. Accordingly, when laser beams from the two interferometers 17Y1 and 17Y2 are incident on the moving mirror 16Y within the exposure range 25 on the wafer stage 13, the rotation angle of the reticle which is attributable to the bend of the moving mirror 16Y can be accurately corrected even by the conventional method.

Figure 3B:
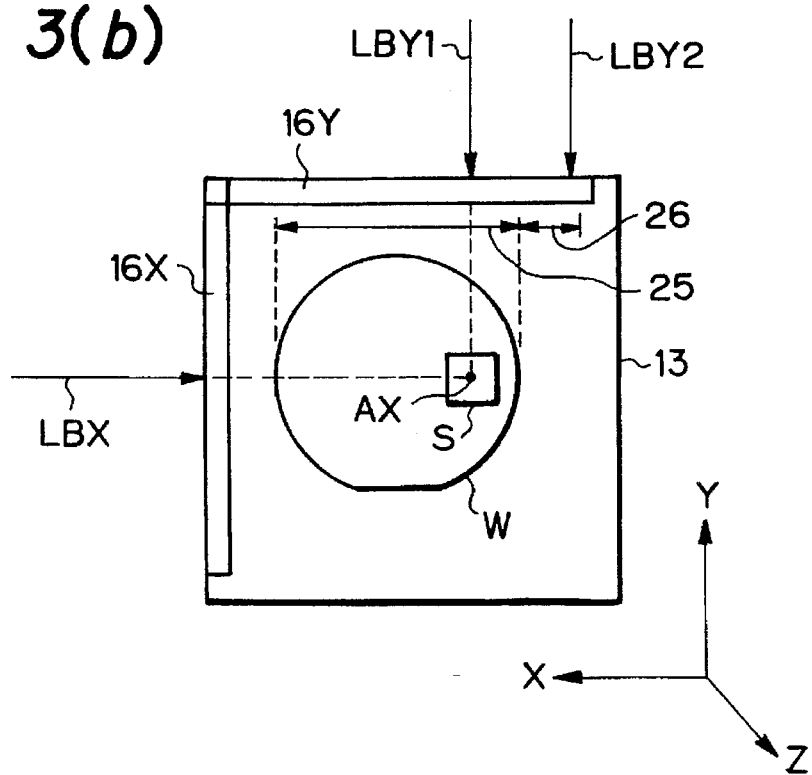
FIG. 3(b) is a plan view showing a state wherein a laser beam from an interferometer for rotation error measurement is outside an exposure range.

However, when the laser beam LBY2 from the interferometer 17Y2 for rotation error measurement is incident on the moving mirror 16Y in a region 26 outside the exposure range 25 because of movement of the wafer stage 13 in the direction +X, as shown in FIG. 3(b), it is impossible with the conventional method to measure an amount of bend of the moving mirror 16Y in the extra-exposure range region 26. Accordingly, when formed by exposure, reticle pattern images are rotated through an angle corresponding to the amount of bend of the moving mirror 16Y in the extra-exposure range region 26, causing the overlay accuracy to reduce. Therefore, in this embodiment, an amount of bend of the moving mirror 16Y in the extra-exposure range region 26 is obtained by a method described below. It should be noted that the moving mirror 16X for the X-axis in this embodiment is used for measurement by only one interferometer 17X and hence unnecessary to subject to measurement of an amount of bend in a region outside the exposure range in particular.

Figure 1B:
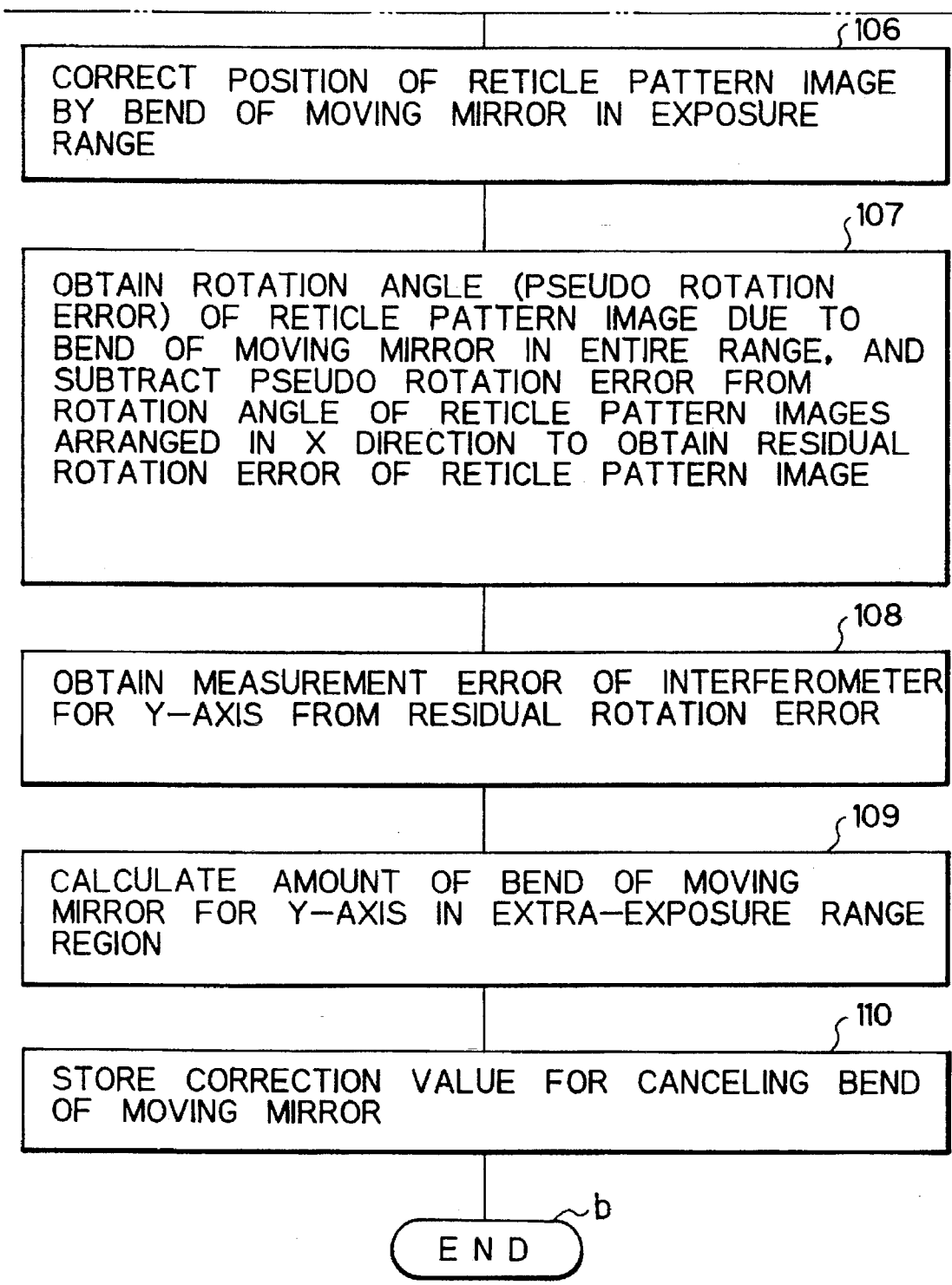

Next, one example of the method of measuring an amount of bend of the moving mirror 16Y in this embodiment will be explained with reference to the flowchart of FIG. 1. First, at Step 101 in FIG. 1, the test reticle R1, shown in FIG. 4(a), is loaded onto the reticle stage RS, shown in FIG. 2, and alignment of the test reticle R1 is effected by using the RA systems 10A and 10B. Further, an unexposed wafer W coated with a photoresist is loaded onto the wafer holder (not shown) mounted on the wafer stage 13.

Thereafter, at Step 102, the wafer stage 13, shown in FIG. 2, is stepwisely driven while exposure is sequentially carried out, thereby forming reticle pattern images S(1,1), S(1,2), . . . S(1,9), which are images of the test reticle R1, on the wafer F in respective regions in a first row along a straight line 34A parallel to the X-axis at a predetermined pitch such that the opposing end portions of each pair of adjacent reticle pattern images overlap each other, as shown in FIG. 6(a). Next, reticle pattern images S(2,1) . . . S(2,9), which are images of the test reticle R1, are similarly formed on the wafer W in respective regions in a second row along a straight line 34B parallel to the X-axis at a predetermined pitch such that the opposing end portions of each pair of adjacent reticle pattern images overlap each other. At this time, the reticle pattern images in the first row and the reticle pattern images in the second row are formed such that the end portions of the reticle pattern images in the two rows which lie adjacent to each other in the direction Y overlap each other by a predetermined width. Thereafter, reticle pattern images S(3,1) . . . S(3,9) and S(4,1) . . . S(4,9) are similarly formed on the wafer W at respective positions in third and fourth rows extending along respective straight lines 34C and 34D which are parallel to the X-axis such that the X- and Y-direction end portions of each pair of adjacent reticle pattern images overlap each other.

Let us assume that, as shown in FIG. 6(a), the moving mirror 16Y is bent as shown by the curve 35. In this case, each reticle pattern image S(i,j) formed by exposure has been rotated for correction through a rotation angle corresponding to the sum of a rotation error due to the bend of the moving mirror 16Y and a rotation error due to yawing of the wafer stage 13. Thus, the yawing of the wafer stage 13 is corrected. However, each reticle pattern image has been over-corrected for the rotation angle by an amount corresponding to a pseudo rotation error produced according to the rotation error due to the bend of the moving mirror 16Y. In other words, the rotation angle remaining in each reticle pattern image S(i,j) is only a pseudo rotation error due to the bend of the moving mirror 16Y.

Next, upon completion of the exposure for the wafer W, at Step 103, the photoresist on the wafer W is developed to produce the evaluation mark images in each reticle pattern image formed on the wafer W as dimple patterns. The wafer W after the development process is placed on the wafer stage 13, shown in FIG. 2, and the coordinates of the evaluation mark images in the stage coordinate system (X,Y) are measured by using the LSA type alignment system 20 for the Y-axis and the LSA type alignment system (not shown) for the X-axis, thereby measuring an amount of positional displacement between each pair of adjacent reticle pattern images.

First, at Step 104, a rotation angle of the reticle pattern images at each position in the direction X, i.e. a rotation angle of the test reticle R1 at that position, is obtained from the amount of positional displacement between each pair of reticle pattern images lying adjacent to each other in the direction Y (hereinafter referred to as "vertical direction") in the four rows shown in FIG. 6(a). Thereafter, at Step 105, the amount of positional displacement between each pair of reticle pattern images lying adjacent to each other in the direction X (hereinafter referred to as "horizontal direction") in FIG. 6(a) is corrected by the rotation angle of the test reticle R1 obtained at Step 104, thus calculating an amount of bend of the moving mirror 16Y for the Y-axis in the exposure range 25 on the wafer W, and assuming that the bend of the moving mirror 16Y in the extra-exposure range region 26 is a straight-line form. In this case, if the inclination angle of the bend of the moving mirror 16Y at its -X direction end portion within the exposure range 25 is represented by $\theta$, the bend of the moving mirror 16Y in the extra-exposure range region 26 is assumed to be a straight line of inclination angle $\theta$. The operations carried out at the above Steps 104 and 105 will be explained below more specifically with reference to FIG. 7.

FIG. 7 shows a part of the reticle pattern images in two rows shown in FIG. 6(a). However, the arrangement of the reticle pattern images shown in FIG. 7 is different from that shown in FIG. 6(a) for the sake of description. At Step 104, for example, the evaluation mark image 32d in the first reticle pattern image S(1,1) in the first row and the evaluation mark image 32b in the first reticle pattern image S(2,1) in the second row are subjected to measurement of an amount of positional displacement $\Delta x1$ in the direction X. The amount of positional displacement $\Delta x1$ is the amount of positional displacement between the reticle pattern images S(1,1) and S(2,1) which lie adjacent to each other in the vertical direction (direction Y). Similarly, amounts of positional displacement $\Delta x2$, $\Delta x3$, . . . between the second and following reticle pattern images S(1,j) (j=2, 3, . . . ) in the first row and the reticle pattern images S(2,j) which lie adjacent thereto in the vertical direction are measured.

In this case, the amount of bend of the moving mirror 16Y is the same at positions of the same X coordinate. Therefore, the rotation angles of each pair of vertically adjacent reticle pattern images in the first and second rows can be regarded as being equal to each other. Accordingly, assuming that the distance from the center of the reticle pattern image S(1,1), for example, to the evaluation mark image 32d is D1, and the rotation angle of the reticle pattern image S(1,1) is $\phi$, the expression $D1 \cdot \phi = \Delta x1/2$ holds. Hence, the rotation angle $\phi$ is given by approximately $\Delta x1/(2 \cdot D1)$. Similarly, the rotation angle of the second and following reticle pattern images S(1,j) is given by approximately $\Delta xj/(2 \cdot D1)$. In this way, the rotation angles of the reticle pattern images are measured from the amount of positional displacement between the evaluation mark images in each pair of adjacent reticle pattern images. This is the vernier evaluation method. In this embodiment, reticle pattern images are formed in four rows, as shown in FIG. 6(a); therefore, the measurement may be carried out such that a rotation angle is obtained for each of the reticle pattern images in the first to third rows, and an average value of the rotation angles is determined to be a rotational angle of the reticle pattern images at each position in the direction X. By averaging the rotation angles in this way, errors in detection by the alignment systems are reduced.

Thereafter, at Step 105, an amount of positional displacement $\Delta y1$ in the direction Y between the evaluation mark image 32a of the first reticle pattern image S(1,1) in the first row and the evaluation mark image 32c of the second reticle pattern image S(1,2) in the first row is measured. The amount of positional displacement Δy1 is the amount of positional displacement between the reticle pattern images S(1,1) and S(1,2), which lie adjacent to each other in the horizontal direction (direction X). Similarly, amounts of positional displacement Δy2, Δy3, . . . between the second and following reticle pattern images S(1,j) (j=2, 3 . . .) in the first row and the reticle pattern images S(1,j+1)) which lie adjacent thereto in the horizontal direction are measured.

Next, the amounts of positional displacement Δy1, Δy2, Δy3, . . . in the direction Y are corrected because they contain a displacement component derived from the rotation of each reticle pattern image. The correction of the positional displacement will be explained below more specifically. In the following discussion, the amount of positional displacement between evaluation mark images is used in place of the rotation angle because the distance from the center of each reticle pattern image to the evaluation mark image 32d and the distance from the reticle pattern image center to the evaluation mark image 32a are equal to each other. First, the amount of positional displacement Δy1 in the direction Y between the first and second reticle pattern images S(1,1) and S(1,2) in the first row contain the amount of positional displacement Δx1/2 attributable to the rotation of the first reticle pattern image S(1,1) and the amount of positional displacement Δx2/2 attributable to the rotation of the second reticle pattern image S(1,1). Accordingly, the corrected amount of positional displacement in the direction Y between the first and second reticle pattern images is (Δy1-Δx1/2-Δx2/2). Similarly, the amount of positional displacement between each pair of reticle pattern images lying adjacent to each other in the direction X is corrected by the rotation angle of the test reticle R1 obtained at Step 104.

The amount of positional displacement in the direction Y between each pair of reticle pattern images lying adjacent to each other in the direction X, which has been corrected for the rotation angle of the test reticle R1 as described above, accurately expresses an amount of bend of the moving mirror 16Y at the corresponding position. Therefore, an amount of bend of the moving mirror 16Y in the exposure range 25 can be accurately obtained from the amount of positional displacement in the direction Y.

The fact that the reticle pattern images in each row shown in FIG. 7 are rotated in the form of a quadratic curve (circular arc) as a whole reveals that the moving mirror 16Y is also bent in the form of a quadratic curve. Most of the actual moving mirrors may be regarded as having a quadratic curve-like bend. The moving mirror bend measuring method according to the present invention is particularly effective when the bend of the moving mirror is in the form of a quadratic curve.

Next, the process proceeds to Step 106. Step 106 will be explained below with reference to FIGS. 6(a) to 6(d). At Step 106, the position of each reticle pattern image S(i,j) shown in FIG. 6(a) is corrected in the direction Y by an amount corresponding to the amount of bend of the moving mirror 16Y in the exposure range 25 calculated at Step 105. The position of each reticle pattern image S(i,j) after the correction is shown in FIG. 6(b). The curve that expresses the bend of the moving mirror 16Y corresponding to each reticle pattern image S(i,j) shown in FIG. 6(b) becomes straight in the exposure range 25, i.e. a straight line 36 parallel to the X-axis. In the extra-exposure range region 26, the curve remains the same as the curve 36a shown in FIG. 6(a). The rotation angle of each reticle pattern image S(i,j) shown in FIG. 6(b) comprises only the actual rotation angle attributable to the bend of the moving mirror 16Y.

Then, at Step 107, a rotation angle of each reticle pattern image S(i,j) attributable to the bend of the moving mirror 16Y, i.e. a pseudo rotation error, is obtained over the entire range. In this case, the amount of bend of the moving mirror 16Y in the exposure range 25 is a quantity obtained by actual measurement, whereas the amount of bend of the moving mirror 16Y in the extra-exposure range region 26 is a quantity approximated with a straight line 38b shown by the dotted line in FIG. 6(c). Then, the pseudo rotation error obtained as described above is subtracted from the rotation angle of each reticle pattern image S(i,j) shown in FIG. 6(b) to obtain a residual rotation error. As a result, the residual rotation error in the first to sixth reticle pattern images S(i,j) in each row becomes zero, as shown in FIG. 6(c). It should be noted that, in this example, it is assumed that, when the laser beam from the interferometer 17Y2 for rotation error measurement, shown in FIG. 3(a), is incident on the moving mirror 16Y in the extra-exposure range region 26, the laser beam from the interferometer 17Y1 for coordinate measurement is incident on the moving mirror 16Y in a region 37 which covers the seventh to ninth reticle pattern images shown in FIG. 6(c).

Accordingly, a relatively large residual rotation error is left only in the seventh to ninth reticle pattern images S(i,j) (j=7 to 9) in FIG. 6(c). To obtain the actual bend of the moving mirror 16Y in the extra-exposure range region 26 from the residual rotation error, the process proceeds to Step 108, at which, first, an average value of the residual rotation errors of the first to sixth reticle pattern image S(i,j) (j=1 to 6) in FIG. 6(c) is obtained and defined as a reference value, and the reference value is subtracted from the residual rotation errors of the seventh to ninth reticle pattern image S(i,j) (j=7 to 9) to obtain relative residual rotation errors. The relative residual rotation errors arise because the bend of the moving mirror 16Y which is represented by the solid curve 36a in the extra-exposure range region 26 is assumed to be the dotted straight line 38b.

Next, assuming that the distance in the direction X between the laser beams from the two interferometers 17Y1 and 17Y2 shown in FIG. 3(a) is D2, and that, in FIG. 6(c), the relative residual rotation error of the seventh reticle pattern image S(1,7), for example, is the angle θ₇ [rad], the relative error of values measured by the two interferometers 17Y1 and 17Y2 during the exposure carried out to form the reticle pattern image S(1,7) is approximately D2.θ₇. Similarly, relative errors of values measured by the two interferometers 17Y1 and 17Y2 during the exposure for forming the eighth and ninth reticle pattern images S(1,8) and S(1,9) are obtained.

At Step 109, an amount of bend of the moving mirror 16Y at a position where the laser beam from the interferometer 17Y2 is incident during the exposure for forming the reticle pattern image S(1,7) is calculated by adding the error D2.θ₇ to the value of the dotted straight line 38b (see FIG. 6(c)). Similarly, an amount of bend of the moving mirror 16Y in the extra-exposure range region 26 is calculated. Thereafter, at Step 110, the main control system 18, shown in FIG. 2, stores correction values for values measured by the two interferometers 17Y1 and 17Y2 for canceling the calculated bend of the moving mirror 16Y over the entire range into an internal memory unit provided in the main control system 18. Thereafter, the wafer stage 13 is driven by using values obtained by correcting values measured by the two interferometers 17Y1 and 17Y2 by the correction values. Thus, reticle pattern images S(1,1) to S(1,9) are formed in parallel to the X-axis, as shown in FIG. 6(d). That is, the wafer stage 13 can be driven in the same way as in a case where a straight moving mirror such as that shown by the straight line 39 is used.

Although in the foregoing embodiment LSA type alignment systems are used, it should be noted that it is also possible to use image processing type alignment systems, two-beam interference type alignment systems, etc. Further, it is possible to use not only TTL (Through-The-Lens) alignment systems but also TTR (Through-The-Reticle) or off-axis alignment systems. Furthermore, although in the foregoing embodiment developed evaluation mark images are used as an object to be measured, evaluation mark images in the state of being latent images may be subjected to measurement.

The present invention can be similarly applied to measure a bend of a moving mirror in other types of exposure system, e.g. a step-and-scan exposure system in which exposure is carried out with a reticle and a wafer being scanned synchronously. Thus, the present invention is not necessarily limited to the described embodiment, but may adopt various arrangements without departing from the gist of the present invention.

The present invention provides the following advantages: It is possible to accurately obtain an amount of bend of a moving mirror as an object to be measured in a region outside the exposure range from a difference between the actually measured rotation angle of each mask pattern and the rotation angle of each mask pattern obtained from the amount of bend of the moving mirror, which is accurately obtained in the exposure range, and on the basis of a form of bend assumed in the extra-exposure range region. Accordingly, by correcting values measured with the coordinate measuring device and the rotation angle measuring device so that the accurately obtained amount of bend is canceled, only the yawing (rotation error) of the substrate stage (wafer stage) can be accurately corrected, and the mask pattern can be formed by exposure at an accurate position and with an accurate rotation angle. Therefore, the matching accuracy between exposure systems improves.

Further, a rotation error of the substrate stage can be accurately measured not only for exposure process but also for alignment of a photosensitive substrate, and an Abbe error or other error of an alignment system can be accurately corrected on the basis of the measured rotation error. Accordingly, the alignment accuracy further improves.

Further, the method according to the present invention may be carried out as follows: At the first step, evaluation mask patterns are transferred by exposure onto respective regions on an evaluation photosensitive substrate which are arranged in two rows parallel to the second direction (direction X), and at the second step, rotation angles of the evaluation mask patterns formed when the evaluation photosensitive substrate moves in the second direction are calculated from an amount of positional displacement ($\Delta x$) between the rows of evaluation mask patterns. In this case, the rotation angle of each evaluation mask pattern can be accurately and readily calculated independently of the bend of the moving mirror.

What is claimed is:

1. A method for measuring an amount of bend of a moving mirror in an exposure system, said exposure system including:

a mask stage for correcting a rotation angle of a mask formed with a pattern to be transferred;

a substrate stage for moving a photosensitive substrate, onto which the pattern of said mask is to be transferred under application of illuminating light for exposure, in a first direction and a second direction, which intersect each other;

a first moving mirror fixed on said substrate stage and having a reflecting surface approximately perpendicular to said first direction;

a second moving mirror fixed on said substrate stage and having a reflecting surface approximately perpendicular to said second direction;

coordinate measuring sensor for applying a light beam for coordinate measurement to each of said first and second moving mirrors to measure coordinates of said substrate stage in said first and second directions; and rotation angle measuring sensor for applying a light beam for rotation angle measurement to said first moving mirror to measure a rotation angle of said substrate stage;

wherein said mask is rotated through said mask stage so that the rotation angle measured by said rotation angle measuring means is canceled;

said method for measuring an amount of said first moving mirror, comprising:

the first step where an evaluation mask formed with predetermined marks for evaluation is used as said mask, and a photosensitive substrate for evaluation is placed on said substrate stage and moved through said substrate stage, thereby transferring patterns of said evaluation mask onto a plurality of positions, respectively, which are arranged in said second direction on said evaluation photosensitive substrate;

the second step where rotation angles of said evaluation mask patterns transferred onto said plurality of positions on said evaluation photosensitive substrate when said evaluation photosensitive substrate moves in said second direction are calculated from the positions of said evaluation mask patterns on said evaluation photosensitive substrate;

the third step where an amount of bend of said first moving mirror in a region corresponding to an exposure range for forming said evaluation mask patterns on said evaluation photosensitive substrate is calculated from a series of rotation angles calculated at said second step, and a bend of said first moving mirror in a region corresponding to a region outside the exposure range on said evaluation photosensitive substrate is assumed to be a predetermined form from the series of rotation angles calculated at said second step;

the fourth step of obtaining residual rotation errors between rotation angles of said evaluation mask patterns which are determined according to the bend of said first moving mirror obtained at said third step and the rotation angles of said evaluation mask patterns calculated at said second step; and the fifth step of obtaining a bend of said first moving mirror in the region corresponding to a region outside the exposure range on said evaluation photosensitive substrate from the residual rotation errors obtained at said fourth step.

2. A method according to claim 1, wherein at said first step, patterns of said evaluation mask are transferred onto respective regions on said evaluation photosensitive substrate which are arranged in two rows parallel to said second direction, and at said second step, rotation angles of said evaluation mask patterns formed when said evaluation photosensitive substrate moves in said second direction are calculated from an amount of positional displacement between said rows of evaluation mask patterns.

3. A method for measuring an amount of bend of a mirror provided on a stage for mounting a substrate, said method comprising the steps of:

measuring a plurality of points on said mirror to obtain a yawing of said stage;

repeating projection of a pattern of a mask onto said substrate by exposure as well as movement of said stage, thereby forming patterns for measurement at a plurality of positions on said substrate by exposure;

measuring a positional displacement between a pair of adjacent patterns among said plurality of patterns; and obtaining a bend of said mirror on the basis of said positional displacement between the pair of adjacent patterns as well as said yawing.

4. A method according to claim 3, wherein said step of forming said patterns for measurement by exposure includes a step of rotating said mask and said substrate relative to each other on the basis of said yawing.

5. A method according to claim 3, wherein said stage is moved in two-dimensional directions and has two mirrors for reflecting light from respective sensors for measuring positions of said stage in said two-dimensional directions, so that, when said stage is moved in one of said two-dimensional directions, a plurality of points on said mirror for position measurement in the other direction are measured, thereby obtaining said yawing.

6. A method for measuring an amount of bend of a mirror provided on a stage for mounting a substrate, said method comprising the steps of:

repeating projection of a pattern of a mask onto said substrate by exposure as well as movement of said stage, thereby forming patterns for measurement at a plurality of positions on said substrate by exposure;

measuring a positional displacement between a pair of adjacent patterns among said plurality of patterns; and separating said positional displacement between the pair of adjacent patterns into a yawing of said stage and a bend of said mirror.

7. A method according to claim 6, wherein said step of forming patterns for measurement by exposure includes a step of rotating said mask and said substrate relative to each other on the basis of said yawing.

8. A method for measuring an amount of bend of a mirror provided on a stage for mounting a substrate which is provided in an exposure system in which a pattern of a mask is projected onto said substrate, said method comprising the steps of:

measuring a plurality of points on said mirror to obtain a yawing of said stage; and estimating a bend of said mirror in a region outside an exposure range on said substrate on the basis of said yawing.

9. A method according to claim 8, further comprising the steps of:

repeating projection of the mask pattern onto said substrate by exposure as well as movement of said stage, thereby forming patterns for measurement at a plurality of positions on said substrate by exposure; and measuring a positional displacement between a pair of adjacent patterns among said plurality of patterns;

so that a bend of said mirror in the region outside the exposure range on said substrate is estimated on the basis of said yawing and said positional displacement.

10. A method according to claim 9, wherein said step of forming patterns for measurement by exposure includes a step of rotating said mask and said substrate relative to each other on the basis of said yawing.

11. An exposure method for projecting a pattern of a mask onto a substrate by exposure, said method comprising the steps of:

measuring a plurality of points on a mirror provided on a stage for mounting said substrate, thereby obtaining a yawing of said stage;

repeating projection of the mask pattern onto said substrate by exposure as well as movement of said stage, thereby forming patterns for measurement at a plurality of positions on said substrate;

measuring a positional displacement between a pair of adjacent patterns among said plurality of patterns;

obtaining a bend of said mirror on the basis of said positional displacement of the pair of adjacent patterns and said yawing; and correcting said bend of said mirror, and then projecting said mask pattern onto said substrate.

12. An exposure method for projecting a pattern of a mask onto a substrate by exposure, said method comprising the steps of:

measuring a plurality of points on a mirror provided on a stage for mounting said substrate, thereby obtaining a yawing of said stage;

repeating projection of the mask pattern onto said substrate by exposure as well as movement of said stage, thereby forming patterns for measurement at a plurality of positions on said substrate;

measuring a positional displacement between a pair of adjacent patterns among said plurality of patterns;

estimating a bend of said mirror in a region outside an exposure range on said substrate on the basis of said yawing, and measuring a bend of said mirror; and correcting said bend of said mirror, and projecting said mask pattern onto said substrate.

13. A method for measuring an amount of bend of a moving mirror provided in coordinate measuring sensor, said coordinate measuring sensor including: a substrate stage for moving a photosensitive substrate, onto which a predetermined pattern formed on a mask is to be transferred, in a first direction and a second direction, which intersect each other; a first moving mirror fixed on said substrate stage and having a reflecting surface approximately perpendicular to said first direction; and a second moving mirror fixed on said substrate stage and having a reflecting surface approximately perpendicular to said second direction; so that a light beam for coordinate measurement is applied to each of said first and second moving mirrors to measure coordinates of said substrate stage in said first and second directions;

said method for measuring an amount of bend of said first moving mirror, comprising the steps of:

projecting patterns of an evaluation mask by exposure at a plurality of positions which are arranged in said second direction on said photosensitive substrate;

measuring a positional relationship between said mask patterns on said photosensitive substrate;

obtaining a bend of said first moving mirror in a region corresponding to an exposure range of said mask patterns on the basis of said positional relationship between said mask patterns; and obtaining a bend of said first moving mirror in a region corresponding to a region outside said exposure range of said mask patterns on the basis of said obtained bend of said first moving mirror.

14. A method according to claim 13, further comprising the steps of:

applying a light beam for rotation angle measurement onto said first moving mirror to measure a rotation angle of said substrate stage; and adjusting a positional relationship between said mask and said photosensitive substrate so that said rotation angle is canceled, and then projecting said mask pattern onto said photosensitive substrate by exposure.

* * * * *